(12) United States Patent
Iwamatsu

(10) Patent No.: US 6,339,623 B1
(45) Date of Patent: Jan. 15, 2002

(54) REFERENCE CARRIER GENERATOR DEVICE FOR PULLING A REFERENCE CARRIER OUT OF A FALSE STABILIZED POINT INTO A CORRECT STABILIZED POINT OF SYNCHRONISM

(75) Inventor: Takanori Iwamatsu, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/081,352

(22) Filed: May 19, 1998

(30) Foreign Application Priority Data

Nov. 10, 1997 (JP) .............................. 9-306919

(51) Int. Cl.[7] .............................................. H03D 3/18
(52) U.S. Cl. ...................................................... 375/327
(58) Field of Search ................................. 375/376, 327, 375/329, 326; 329/302, 307, 308, 309

(56) References Cited

U.S. PATENT DOCUMENTS

| | | | | |
|---|---|---|---|---|
| 3,978,411 A | * | 8/1976 | Sakamoto ................. | 455/167.1 |
| 4,205,347 A | * | 5/1980 | Minoura et al. ............ | 348/731 |
| 4,300,165 A | * | 11/1981 | Kim ........................... | 348/735 |
| 5,260,671 A | * | 11/1993 | Iso et al. .................... | 329/302 |
| 5,400,366 A | | 3/1995 | Iwamatsu .................... | 375/97 |
| 5,533,059 A | * | 7/1996 | Tsuda ......................... | 375/329 |
| 5,594,759 A | | 1/1997 | Iwamatsu .................... | 375/344 |
| 5,661,761 A | | 8/1997 | Iwamatsu .................... | 375/344 |
| 5,881,111 A | * | 3/1999 | Anzai ......................... | 375/327 |
| 5,903,748 A | * | 5/1999 | McCollough et al. ....... | 713/503 |

FOREIGN PATENT DOCUMENTS

| EP | 0291947 | * | 11/1988 | ................. | 375/327 |
|---|---|---|---|---|---|

* cited by examiner

*Primary Examiner*—Chi Pham
*Assistant Examiner*—Kevin M Burd
(74) *Attorney, Agent, or Firm*—Roseman & Colin LLP

(57) ABSTRACT

A reference carrier generator device includes a phase error detection unit which detects a phase error between a reference carrier and a carrier of a quadrature modulated wave and outputs a phase error signal indicating the phase error. A loop filter passes the phase error signal from the phase error detection unit through the loop filter and converts the phase error signal into a control voltage. A voltage-controlled oscillator outputs a reference carrier synchronous with the carrier of the quadrature modulated wave based on the control voltage. A sweep unit changes the control voltage output to the oscillator when pulling the reference carrier into synchronism in response to an out-of-sync alarm signal. The sweep unit outputs a staircase sweep signal having a selected level, the sweep signal being added to the phase error signal such that the control voltage output to the oscillator is changed by the staircase sweep signal.

9 Claims, 9 Drawing Sheets

REFERENCE CARRIER GENERATOR DEVICE FOR PULLING A REFERENCE CARRIER OUT OF A FALSE STABILIZED POINT INTO A CORRECT STABILIZED POINT OF SYNCHRONISM

BACKGROUND OF THE INVENTION (1) Field of the Invention

The present invention relates to a reference carrier generator device for use in a demodulator system which outputs quadrature demodulated signals by synchronous detection and demodulation of a quadrature modulated wave.

A demodulator system outputs quadrature demodulated signals by synchronous detection and demodulation of a quadrature modulated wave when the modulated wave is received. Generally, the demodulator system is provided with a reference carrier generator device which outputs a reference carrier synchronous with a carrier of the modulated wave.

There are several existing demodulator systems having various configurations. It is desired that a reference carrier generator device be configured to output a reference carrier that quickly responds to a change of the carrier of the quadrature modulated wave. It is desired that the reference carrier generator device provide a broad capability to pull the reference carrier into synchronism while avoiding a false stabilized point of synchronism.

(2) Description of the Related Art

FIG. 6 shows a conventional analog demodulator system.

As shown in FIG. 6, in the conventional analog demodulator system, a synchronous detection unit 51, a roll-off filter 52, a roll-off filter 53, an analog-to-digital (A/D) converter 54, an analog-to-digital (A/D) converter 55, and a transversal equalizer 56 are provided. Further, a voltage-controlled oscillator 57, a voltage-controlled clock generator 58, a reference carrier generator device 59, a control unit 63, and a low-pass filter 64 are provided.

In the conventional analog demodulator system of FIG. 6, the voltage-controlled oscillator 57 outputs a reference carrier to the synchronous detection unit 51. The voltage-controlled clock generator 58 outputs a sampling clock to both the A/D converter 54 and the A/D converter 55.

A quadrature modulated wave is produced based on, for example, quadrature amplitude modulation (QAM). In the conventional analog demodulator system of FIG. 6, an intermediate-frequency quadrature modulated wave (IN) is input to the synchronous detection unit 51 when the modulated wave is received.

In the synchronous detection unit 51, synchronous detection of an I-channel signal and a Q-channel signal from the quadrature modulated wave IN is performed based on the reference carrier from the voltage-controlled oscillator 57. The I-channel signal and the Q-channel signal, output by the synchronous detection unit 51, are passed through the roll-off filter 52 and the roll-off filter 53, and input to the A/D converter 54 and the A/D converter 55, respectively.

The I-channel signal and the Q-channel signal are converted into digital signals by the A/D converter 54 and the A/D converter 55 based on the sampling clock from the voltage-controlled clock generator 58, and the digital signals are input to the equalizer 56. The equalizer 56 outputs an I-channel demodulated signal (Iout) and a Q-channel demodulated signal (Qout). The demodulated signals Iout and Qout are further supplied to a next circuit (not shown) connected to an output of the conventional analog demodulator system.

In the reference carrier generator device 59, as shown in FIG. 6, a phase error detection unit 60, a loop filter 61, and a sweep unit 62 are provided. However, a modification may be made such that the reference carrier generator device 59 further includes the voltage-controlled oscillator 57. See Japanese Laid-Open Patent Application No.1-78058 (Japanese Patent No. 2,553,103) for a background technology of the reference carrier generator device of the present invention.

In the reference carrier generator device 59 of FIG. 6, the phase error detection unit 60 detects a phase error between a reference carrier and the carrier of the quadrature modulated wave IN based on the demodulated signals Iout and Qout from the equalizer 56. Suppose that "Pe" indicates a reference carrier phase error signal, "Id" indicates an I-channel identifying signal, "Qd" indicates a Q-channel identifying signal, "Ie" indicates an I-channel phase error signal, and "Qe" indicates a Q-channel phase error signal. The phase error detection unit 60 outputs the phase error signal Pe indicating the phase error between the reference carrier and the carrier of the quadrature modulated wave IN, which is represented by the formula:

$$Pe = Id \times Qe - Ie \times Qd \qquad (1)$$

See Japanese Laid-Open Patent Application No. 6-54014 for a background technology of the reference carrier generator device of the present invention.

In the reference carrier generator device 59 of FIG. 6, the phase error signal Pe from the phase error detection unit 60 is passed through the loop filter 61 and converted into a control voltage by the loop filter 61. The sweep unit 62 supplies the control voltage, output by the loop filter 61, to the voltage-controlled oscillator 57. The voltage-controlled oscillator 57 outputs the reference carrier to the synchronous detection unit 51 based on the control voltage from the sweep unit 62, the reference carrier being synchronous with the carrier of the quadrature modulated wave IN.

The sweep unit 62 changes the control voltage output to the voltage-controlled oscillator 57, in order to provide a broad capability to pull the reference carrier into synchronism. An error detection unit (not shown) is provided on the output side of the conventional analog demodulator system. The error detection unit detects whether an out-of-sync error of the reference carrier is increasing. When the out-of-sync error of the reference carrier is detected as increasing, it is determined that the reference carrier is going out of synchronism. The error detection unit in such a case outputs an out-of-sync alarm signal to the sweep unit 62, and the sweep unit 62 changes the control voltage upon receiving the out-of-sync alarm signal. When the out-of-sync error of the reference carrier is detected as decreasing, it is determined that the reference carrier is being pulled into synchronism. The error detection unit in such a case outputs no alarm signal to the sweep unit 62, and the sweep unit 62 stops changing the control voltage.

The control unit 63 detects a clock component based on the demodulated signals Iout and Qout from the equalizer 56, and supplies a control voltage to the voltage-controlled clock generator 58 through the low-pass filter 64. The voltage-controlled clock generator 58 outputs the sampling clock to both the A/D converter 54 and the A/D converter 55 in accordance with the control voltage from the control unit 63.

FIG. 7 shows a conventional digital demodulator system.

As shown in FIG. 7, in the conventional digital demodulator system, a quasi synchronous detection unit 71, a roll-off filter 72, a roll-off filter 73, an analog-to-digital (A/D)

converter 74, an analog-to-digital (A/D) converter 75, an equalizer 76, and a phase rotation unit 77 are provided. Further, a voltage-controlled phase signal generator 78, a reference carrier generator device 79, a control unit 83, a low-pass filter 84, a voltage-controlled clock generator 85, and a local oscillator 86 are provided.

In the conventional digital demodulator system of FIG. 7, an intermediate-frequency quadrature modulated wave (IN) is input to the quasi synchronous detection unit 71 when the modulated wave is received. The local oscillator 86 outputs a fixed-frequency signal to the quasi synchronous detection unit 71. The fixed-frequency signal from the local oscillator 86 is preset such that a fixed frequency of the signal from the local oscillator 86 matches with a frequency of the carrier of the quadrature modulated wave IN.

In the quasi synchronous detection unit 71, synchronous detection of an I-channel signal and a Q-channel signal from the quadrature modulated wave IN is performed based on the fixed-frequency signal from the local oscillator 86. In this example, there is always a phase difference (and a frequency difference) between a reference carrier and the carrier of the quadrature modulated wave IN.

In the conventional digital demodulator system of FIG. 7, the phase rotation unit 77 is provided so as to eliminate a phase error between the reference carrier and the carrier of the quadrature modulated wave IN. The voltage-controlled phase signal generator 78 outputs a phase signal to the phase rotation unit 77, the phase signal indicating a controlled phase of the reference carrier. In the phase rotation unit 77, phase rotation of the I-channel I-channel signal and the Q-channel signal, both from the equalizer 76, are controlled in accordance with the phase signal from the voltage-controlled phase signal generator 78. The phase rotation unit 77 outputs an I-channel demodulated signal (Iout) and a Q-channel demodulated signal (Qout) such that the demodulated signals Iout and Qout match with the controlled phase of the reference carrier.

Similar to the example of FIG. 6, in the conventional digital demodulator system of FIG. 7, the voltage-controlled clock generator 85 outputs a sampling clock to both the A/D converter 74 and the A/D converter 75. The I-channel signal and the Q-channel signal from the quasi synchronous detection unit 71 are converted into digital signals by the A/D converter 74 and the A/D converter 75 based on the sampling clock from the voltage-controlled clock generator 85, and the digital signals are input to the equalizer 76.

The control unit 83 detects a clock component based on the demodulated signals Iout and Qout from the phase rotation unit 77, and supplies a control voltage to the voltage-controlled clock generator 85 through the low-pass filter 84. The voltage-controlled clock generator 85 outputs the sampling clock to both the A/D converter 74 and the A/D converter 75 in accordance with the control voltage from the control unit 83.

In the reference carrier generator device 79, as shown in FIG. 7, a phase error detection unit 80, a loop filter 81, and a sweep unit 82 are provided. The voltage-controlled phase signal generator 78 is equivalent to the voltage-controlled oscillator 57 in the example of FIG. 6. The voltage-controlled phase signal generator 78 outputs the phase signal to the phase rotation unit 77 based on a control voltage output from the reference carrier generator device 79.

Similar to the example of FIG. 6, in the reference carrier generator device 79 of FIG. 7, the phase error detection unit 80 detects a phase error Pe between the reference carrier and the carrier of the quadrature modulated wave IN based on the demodulated signals Iout and Qout from the phase rotation unit 77. The phase error signal Pe from the phase error detection unit 80 is passed through the loop filter 81 and converted into the control voltage by the loop filter 81. The sweep unit 82 supplies the control voltage, output by the loop filter 81, to the voltage-controlled phase signal generator 78. The voltage-controlled phase signal generator 78 outputs the phase signal of the reference carrier to the phase rotation unit 77, the reference carrier being synchronous with the carrier of the quadrature modulated wave IN. In the phase rotation unit 77, the phase error between the reference carrier and the carrier of the quadrature modulated wave IN is eliminated by rotating the phase of the reference carrier.

FIG. 8 shows another conventional digital demodulator system.

As shown in FIG. 8, in the conventional digital demodulator system, a quasi synchronous detection unit 91, a roll-off filter 92, a roll-off filter 93, an analog-to-digital (A/D) converter 94, an equalizer 96, and a phase rotation unit 97 are provided. Further, a voltage-controlled clock generator 95, a voltage-controlled phase signal generator 98, a reference carrier generator device 99, a control unit 103, and a low-pass filter 104 are provided.

In the conventional digital demodulator system of FIG. 8, an intermediate-frequency quadrature modulated wave (IN) is input to the A/D converter 94 when the modulated wave is received, and the quadrature modulated wave IN is converted into a digital signal by the A/D converter 94. The digital signal from the A/D converter 94 is input to the quasi synchronous detection unit 91.

In the quasi synchronous detection unit 91, synchronous detection of an I-channel signal and a Q-channel signal from the digital signal (derived from the quadrature modulated wave IN) is performed. The phase rotation unit 97 is provided so as to eliminate a phase error between a reference carrier and the carrier of the quadrature modulated wave IN. Similar to the example of FIG. 7, the voltage-controlled phase signal generator 98 outputs a phase signal to the phase rotation unit 97, the phase signal indicating a controlled phase of the reference carrier. In the phase rotation unit 97, phase rotation of the I-channel signal and the Q-channel signal, both from the equalizer 96, are controlled in accordance with the phase signal from the voltage-controlled phase signal generator 98. The phase rotation unit 97 outputs an I-channel demodulated signal (Iout) and a Q-channel demodulated signal (Qout) such that the demodulated signals Iout and Qout match with the controlled phase of the reference carrier.

In the conventional digital demodulator system of FIG. 8, the voltage-controlled clock generator 95 outputs a sampling clock to the A/D converter 94. The A/D converter 94 outputs the digital signal to the quasi synchronous detection unit 91 based on the sampling clock from the voltage-controlled clock generator 95.

Similar to the example of FIG. 7, as shown in FIG. 8, the reference carrier generator device 99 is essentially the same as the reference carrier generator device 79 of FIG. 7. The control unit 103 and the low-pass filter 104, both shown in FIG. 8, are essentially the same as the control unit 83 and the low-pass filter 84, both shown in FIG. 7. A duplicate description thereof will be omitted.

FIG. 9 shows a configuration of a sweep unit in the demodulator systems of FIG. 6 through FIG. 8. The sweep unit of FIG. 9 corresponds to one of the sweep units 62, 82 and 102 in the reference carrier generator devices of FIG. 6, FIG. 7 and FIG. 8.

In FIG. 9, a loop filter 111, a sweep unit 112, and a voltage-controlled oscillator (VCO) 116 are provided. In the sweep unit 112, as shown in FIG. 9, an adder 113, a sweep signal generator 114, and a switch (SW) 115 are provided.

In the sweep unit of FIG. 9, a phase error signal is passed through the loop filter 111, and converted into a control voltage by the loop filter 111. The sweep unit 112 supplies the control voltage, output by the loop filter 111, to the voltage-controlled oscillator 116. The voltage-controlled oscillator 116 outputs a reference carrier to the above-mentioned synchronous detection unit based on the control voltage from the sweep unit 112, the reference carrier being synchronous with the carrier of the quadrature modulated wave IN.

When no out-of-sync alarm signal (ALM) is input to the switch 115, it is determined that the reference carrier is pulled into synchronism, and the switch 115 is set in an OFF state. The sweep unit 112 stops changing the control voltage output to the oscillator (VCO) 116. The sweep unit 112 supplies the control voltage to the oscillator (VCO) 116 based on the phase error signal from the loop filter 111. A phase of an output signal of the oscillator (VCO) 116 is controlled such that the reference carrier from the oscillator (VCO) 116 quickly responds to a phase error between the reference carrier and the carrier of the quadrature modulated wave.

When an out-of-sync alarm signal (ALM) is input to the switch 115, it is determined that the reference carrier is going out of synchronism under a certain operating condition, and the switch 115 is set in an ON state. A sweep signal, which has, for example, a triangular waveform as shown in FIG. 9, is supplied from the sweep signal generator 114 to the adder 113 through the switch 115. The sweep signal of the triangular waveform from the sweep signal generator 114 is added to the phase error signal from the loop filter 111 by the adder 113. Thus, the sweep unit 112 changes the control voltage output to the oscillator (VCO) 116 upon receiving the out-of-sync alarm signal (ALM), in order to provide a broad capability to pull the reference carrier into synchronism. The oscillator (VCO) 116 outputs the reference carrier based on the changed control voltage, the reference carrier being synchronous with the carrier of the quadrature modulated wave IN. When the reference carrier from the oscillator (VCO) 116 is pulled into synchronism, no out-of-sync alarm signal (ALM) is output to the switch 115 and the switch 115 is again set in the OFF state.

Similar to the example of FIG. 9, in the reference carrier generator devices 59, 79 and 99 in the conventional demodulator systems of FIGS. 6, 7 and 8, a sweep signal having a triangular waveform is added to a phase error signal when an out-of-sync alarm signal (ALM) is received, and the control voltage output to the oscillator (VCO) 116 is changed upon receiving the out-of-sync alarm signal (ALM), in order to provide a broad capability to pull the reference carrier into synchronism.

However, in the conventional demodulator systems, there may be a case in which the reference carrier from the voltage-controlled oscillator is set at a false stabilized point of synchronism. In such a case, the sweep unit 112 (the sweep unit 62, 82 or 102) supplies a control voltage to the voltage-controlled oscillator 116 (the oscillator 57 or the phase signal generator 78 or 98) based on a phase error signal from the loop filter 111, the phase error signal having a waveform opposite to the triangular waveform of the sweep signal from the sweep signal generator 114. The reference carrier from the voltage-controlled oscillator is continuously fixed at a false stabilized point of synchronism. Once the reference carrier is set at a false stabilized point, it is difficult for the reference carrier generator devices of the conventional demodulator systems to pull the reference carrier out of the false stabilized point into a correct stabilized point of synchronism.

Generally, in the conventional demodulator systems, the loop filter 111 is configured by using a digital filter, and the digital filter quickly responds to a change of the carrier of the quadrature modulated wave. In a case in which the loop filter 111 is configured by using a digital filter, it is further difficult for the reference carrier generator devices of the conventional demodulator systems to pull the reference carrier out of the false stabilized point into a correct stabilized point of synchronism.

SUMMARY OF THE INVENTION

An object of the present invention is to provide an improved reference carrier generator device in which the above-mentioned problems are eliminated.

Another object of the present invention is to provide a reference carrier generator device which has a simple configuration and easily and quickly pulls a reference carrier out of a false stabilized point into a correct stabilized point of synchronism even after the reference carrier is set at the false stabilized point.

The above-mentioned objects of the present invention are achieved by a reference carrier generator device which includes: a phase error detection unit which detects a phase error between a reference carrier and a carrier of a quadrature modulated wave and outputs a phase error signal indicating the phase error; a loop filter which passes the phase error signal from the phase error detection unit through the loop filter and converts the phase error signal into a control voltage; a voltage-controlled oscillator which outputs a reference carrier synchronous with the carrier of the quadrature modulated wave based on the control voltage; and a sweep unit which changes the control voltage output to the oscillator when pulling the reference carrier into synchronism in response to an out-of-sync alarm signal, wherein the sweep unit outputs a staircase sweep signal having a selected level, the staircase sweep signal being added to the phase error signal such that the control voltage output to the oscillator is changed by the staircase sweep signal.

The above-mentioned objects of the present invention are achieved by a reference carrier generator device which includes: a phase error detection unit which detects a phase error between a reference carrier and a carrier of a quadrature modulated wave and outputs a phase error signal indicating the phase error; a loop filter which passes the phase error signal from the phase error detection unit through the loop filter and converts the phase error signal into a control voltage; a voltage-controlled oscillator which outputs a reference carrier synchronous with the carrier of the quadrature modulated wave based on the control voltage; and a sweep unit which changes the control voltage output to the oscillator when pulling the reference carrier into synchronism in response to an out-of-sync alarm signal, wherein the sweep unit outputs a sweep signal having a selected level which discontinuously varies from one of a plurality of discrete values to another, the sweep signal being added to the phase error signal such that the control voltage output to the oscillator is changed by the sweep signal.

The reference carrier generator device of the present invention includes the sweep unit which changes the control voltage output to the voltage-controlled oscillator when pulling the reference carrier into synchronism in response to an out-of-sync alarm signal. According to one aspect of the present invention, the sweep unit outputs a staircase sweep signal having a selected level, the sweep signal being added to the phase error signal such that the control voltage output to the oscillator is changed by the staircase sweep signal. According to another aspect of the present invention, the sweep unit outputs a sweep signal having a selected level which discontinuously varies from one of a plurality of discrete values to another, the sweep signal being added to the phase error signal such that the control voltage output to the oscillator is changed by the sweep signal. Therefore, the reference carrier generator device of the present invention is effective in quickly pulling the reference carrier into synchronism while avoiding a false stabilized point of synchronism. Even if the reference carrier is set at a false stabilized point of synchronism, the reference carrier generator device of the present invention is effective in easily and quickly pulling the reference carrier out of the false stabilized point into a correct stabilized point of synchronism.

BRIEF DESCRIPTION OF THE DRAWINGS

The above and other objects, features and advantages of the present invention will become more apparent from the following detailed description when read in conjunction with the accompanying drawings in which.

DESCRIPTION OF THE PREFERRED EMBODIMENTS

A description will now be given of the preferred embodiments of the present invention with reference to the accompanying drawings.

Figure 1:
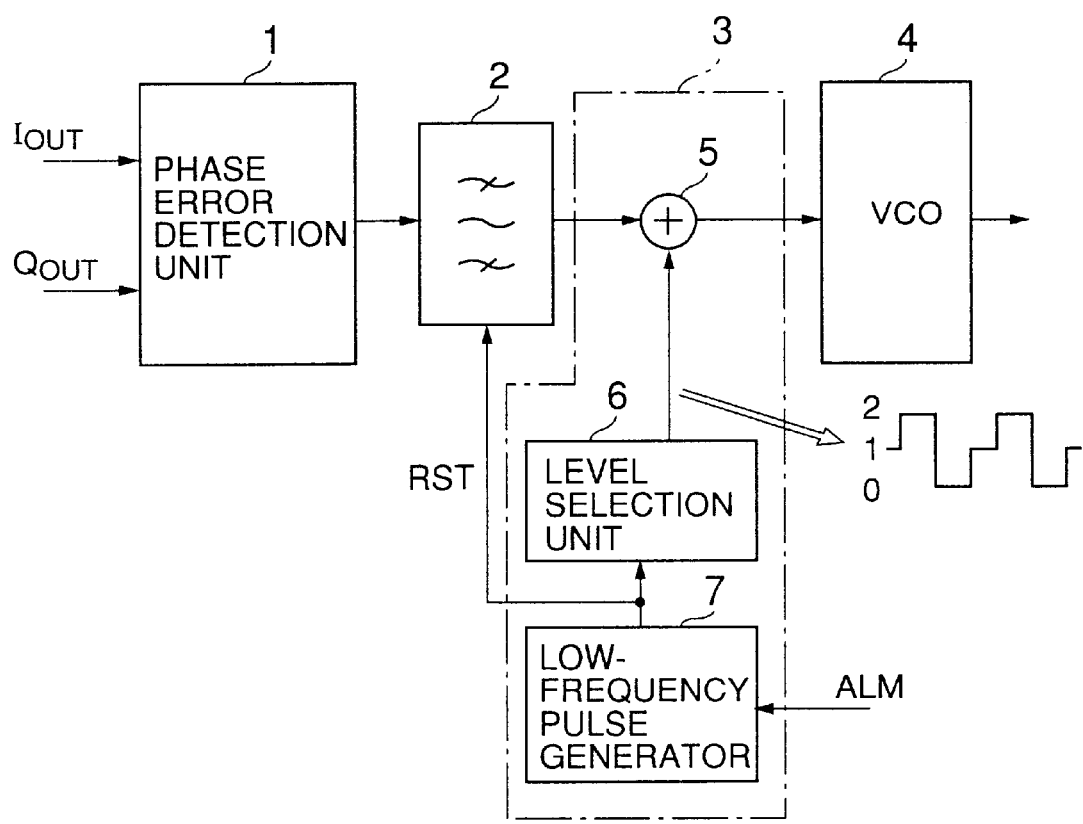
FIG. 1 is a diagram for explaining one embodiment of a reference carrier generator device of the present invention.

FIG. 1 shows one embodiment of a reference carrier generator device of the present invention.

As shown in FIG. 1, in the present embodiment of the reference carrier generator device, a phase error detection unit 1, a loop filter 2, a sweep unit 3, and a voltage-controlled oscillator (VCO) 4 are provided. In the sweep unit 3, an adder 5, a level selection unit 6, and a low-frequency pulse generator 7 are provided.

The phase error detection unit 1 detects a phase error between a reference carrier and a carrier of a quadrature modulated wave based on demodulated signals "Iout " and "Qout", both output by a demodulator system which is either an analog demodulator system or a digital demodulator system. The phase error detection unit 1 outputs a phase error signal to the loop filter 2. In the present embodiment, the phase error signal output by the phase error detection unit 1 is the same as the phase error signal Pe represented by the above-mentioned formula (1).

The phase error signal from the phase error detection unit 1 is passed through the loop filter 2 and converted into a control voltage by the loop filter 2. The sweep unit 3 supplies the control voltage, output by the loop filter 2, to the voltage-controlled oscillator 4. The voltage-controlled oscillator 4 outputs a reference carrier based on the control voltage from the sweep unit 3, the reference carrier being synchronous with the carrier of the quadrature modulated wave that is input to the demodulator system.

In the sweep unit 3 of FIG. 1, the low-frequency pulse generator 7 starts outputting low-frequency pulses upon receiving an out-of-sync alarm signal (ALM). The low-frequency pulse generator 7 stops outputting the low-frequency pulses when no out-of-sync alarm signal (ALM) is received. The level selection unit 6 in the present embodiment is configured by using a counter and a selector. The level selection unit 6 counts the low-frequency pulses from the low-frequency pulse generator 7, and outputs a staircase sweep signal to the adder 5 based on the count of the pulses. As shown on the right side of the level selection unit 6 of FIG. 1, the staircase sweep signal in this embodiment has a selected level which sequentially increases from one of the values zero, one and two to another at given periods in a repeating manner.

The staircase sweep signal from the level selection unit 6 is added to the phase error signal from the phase error detection unit 1 by the adder 5. The sweep unit 3 supplies a control voltage to the voltage-controlled oscillator 4 based on the phase error signal and the staircase sweep signal.

The staircase sweep signal has a selected level which sequentially varies from one of the values zero, one and two to another at given periods in a repeating manner. Therefore, the reference carrier generator device of the present embodiment can easily and quickly pull a reference carrier out of a false stabilized point into a correct stabilized point of synchronism even after the reference carrier is set at the false stabilized point. Even when the loop filter 2 quickly responds to a change of the carrier of the quadrature modulated wave, it is possible for the reference carrier generator device of the present embodiment to easily and quickly pull a reference carrier out of a false stabilized point into a correct stabilized point of synchronism.

Further, in the present embodiment, the low-frequency pulse generator 7 outputs the low-frequency pulses to the loop filter 2 as a reset signal (RST). The low-frequency pulse generator 7 starts outputting the reset signal (RST) to the loop filter 2 upon receiving the out-of-sync alarm signal (ALM). In the loop filter 2, a frequency component of the phase error signal on a frequency-control signal line of the loop filter 2 is reset or eliminated when the reset signal (RST) from the low-frequency pulse generator 7 is input to the loop filter 2. Therefore, the reference carrier generator device of the present embodiment is effective in easily and quickly pulling a reference carrier out of a false stabilized point into a correct stabilized point of synchronism.

Figure 2:
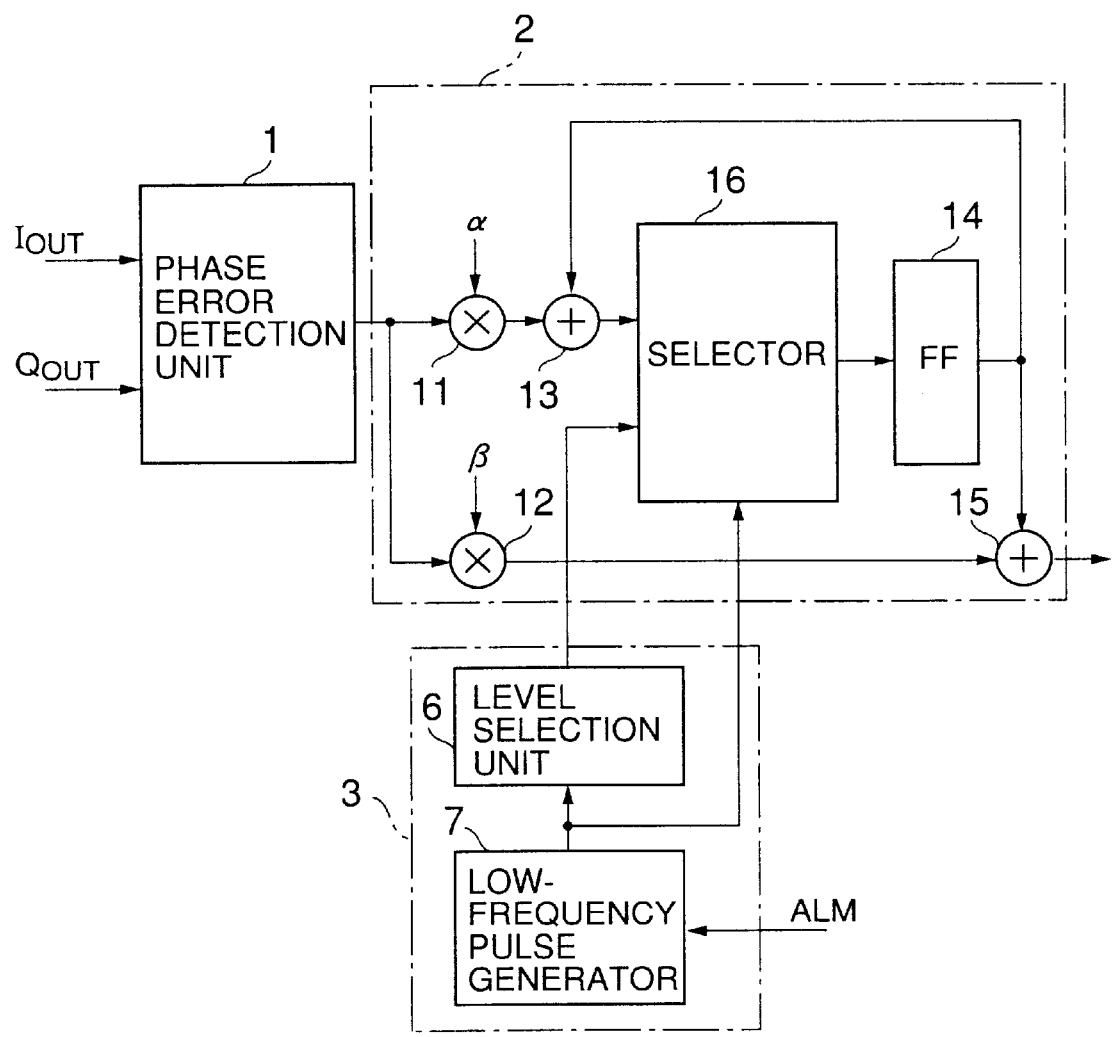
FIG. 2 is a diagram for explaining another embodiment of the reference carrier generator device of the present invention.

FIG. 2 shows another embodiment of the reference carrier generator device of the present invention.

As shown in FIG. 2, in the present embodiment of the reference carrier generator device, the phase error detection unit 1, a loop filter 2, and a sweep unit 3 are provided. The voltage-controlled oscillator (VCO) 4 shown in FIG. 1 is omitted in the embodiment of FIG. 2. In the loop filter 2 of the present embodiment, a multiplier 11, a multiplier 12, an adder 13, a flip-flop (FF) 14, an adder 15, and a selector 16 are provided.

In the sweep unit 3 of FIG. 2, the level selection unit 6 and the low-frequency pulse generator 7 are respectively the same as the level selection unit 6 and the low-frequency pulse generator 7 in FIG. 1.

The loop filter 2 in the present embodiment is configured by using a digital filter including a primary phase-control signal line and a secondary frequency-control signal line.

Figure 3:
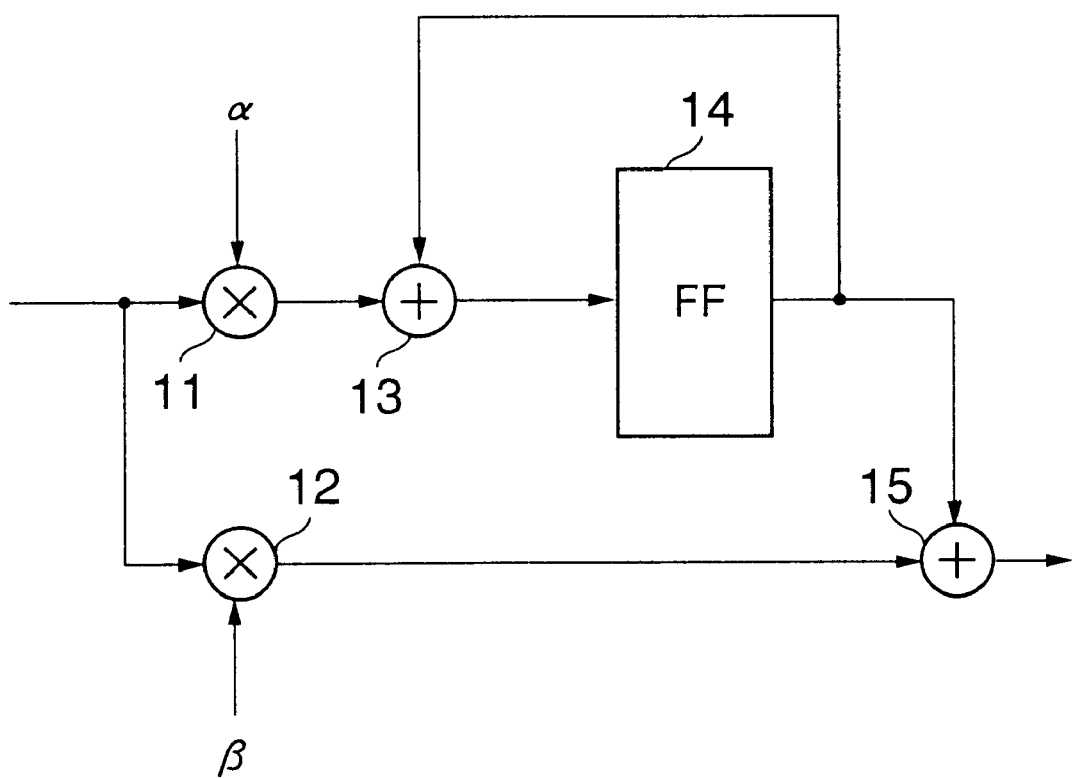
FIG. 3 is a diagram for explaining a configuration of a loop filter in the reference carrier generator device of FIG. 2.

FIG. 3 shows a basic configuration of the loop filter of the present embodiment. In FIG. 3, the elements which are the same as corresponding elements in FIG. 2 are designated by the same reference numerals.

As shown in FIG. 3, in the loop filter of the present embodiment, the multiplier 11 multiplies a phase error signal from the phase error detection unit 1 by a loop bandwidth setting constant "α", and the multiplier 12 multiplies the phase error signal from the phase error detection unit 1 by a loop bandwidth setting constant "β". In the phase-control signal line of the loop filter, the multiplier 12 is provided. In the frequency-control signal line of the loop filter, the multiplier 11, the adder 13, and the flip-flop 14 are provided. An output signal of the flip-flop 14 is returned to the adder 13 in the frequency-control signal line. The output signal of the flip-flop 14 in the frequency-control signal line is superimposed on an output signal of the multiplier 12 in the phase-control signal line by the adder 15. An output signal of the adder 15 is supplied to the voltage-controlled oscillator (not shown) as the control voltage.

The loop filter 2 of FIG. 3 may be substituted for the loop filter 2 in the reference carrier generator device of FIG. 1. In such an embodiment, the pulse from the low-frequency pulse generator 7 is input, upon receiving an out-of-sync alarm signal (ALM), to a reset terminal of the flip-flop 14 as a reset signal (RST). A frequency component of the phase error signal on the frequency-control signal line of the loop filter 2 is reset or eliminated by the flip-flop 14 in response to the reset signal (RST).

In the loop filter 2 of FIG. 2, the selector 16 is provided between the adder 13 and the flip-flop 14 in addition to the elements 11–15 of the loop filter of FIG. 3. The selector 16 has an output connected to an input of the flip-flop 14. The selector 16 has an input connected to an output of the adder 13, an input connected to an output of the level selection unit 6, and an input connected to an output of the low-frequency pulse generator 7.

In the sweep unit 3 of FIG. 2, the low-frequency pulse generator 7 starts outputting low-frequency pulses upon receiving an out-of-sync alarm signal (ALM). The level selection unit 6 counts the low-frequency pulses from the low-frequency pulse generator 7, and outputs a staircase sweep signal to the selector 16 based on the count of the pulses. The staircase sweep signal in this embodiment has a selected level which sequentially increases from one of the values zero, one and two to another at given periods in a repeating manner.

The low-frequency pulse generator 7 outputs a pulse to the selector 16 as a control signal upon receiving the out-of-sync alarm signal (ALM). The selector 16 is controlled by the pulse from the pulse generator 7 such that the staircase sweep signal from the level selection unit 6, instead of the output signal of the adder 13, is supplied to the flip-flop 14 by the selector 16. The output signal (the staircase sweep signal) of the flip-flop 14 is added to the output signal of the multiplier 12 by the adder 15. The output signal of the adder 15 is supplied to the voltage-controlled oscillator (not shown) as the control voltage. A frequency component of the phase error signal from the adder 13 is reset or eliminated by the selector 16 in response to the pulse from the pulse generator 7. The sweep unit 3 changes the control voltage output to the voltage-controlled oscillator by using the staircase sweep signal, upon receiving the out-of-sync alarm signal (ALM).

For example, the reference carrier generator device of FIG. 2 may be configured such that the selector 16 is controlled by a rising edge of the pulse from the pulse generator 7. The level selection unit 6 supplies the staircase sweep signal through the selector 16 to the flip-flop 14 when the pulse from the pulse generator 7 is at the rising edge. In such an embodiment, after the staircase sweep signal is supplied to the flip-flop 14 at a previous time, the selector 16 is reset to the original condition such that the output signal of the adder 13 will be supplied to the flip-flop 14 at a next time.

Figure 4:
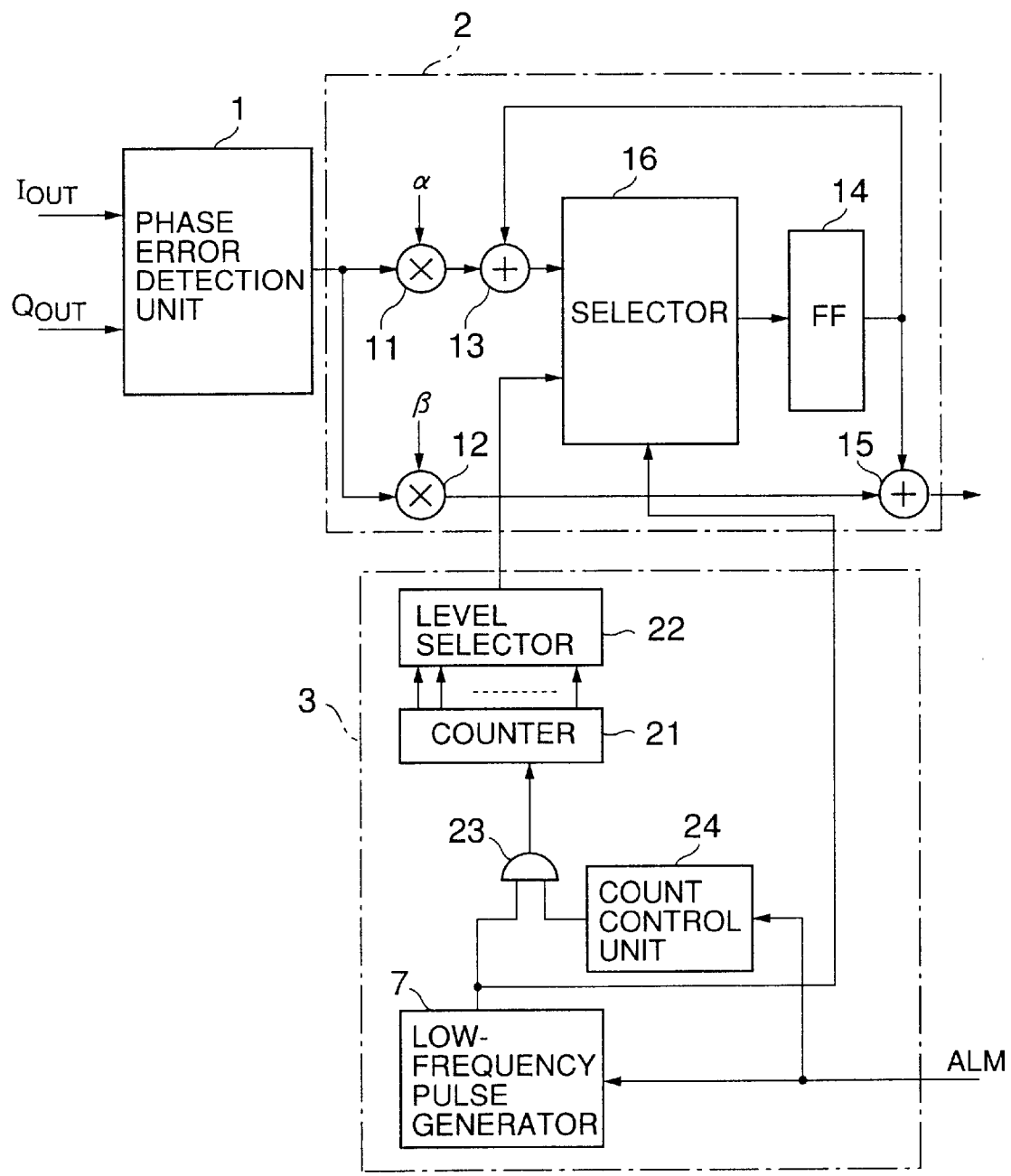
FIG. 4 is a diagram for explaining a further embodiment of the reference carrier generator device of the present invention.

FIG. 4 shows a further embodiment of the reference carrier generator device of the present invention. In FIG. 4, the elements which are the same as corresponding elements in FIG. 2 are designated by the same reference numerals, and a description thereof will be omitted.

As shown in FIG. 4, in the sweep unit 3 of the present embodiment, a counter 21, a level selector 22, a gate circuit 23, a count control unit 24, and the low-frequency pulse generator 7 are provided. The phase error detection unit 1 and the loop filter 2 in the present embodiment are essentially the same as corresponding elements in FIG. 2. The voltage-controlled oscillator (VCO) 4 shown in FIG. 1 is omitted in the embodiment of FIG. 4.

In the embodiment of FIG. 4, the selector 16 has an output connected to an input of the flip-flop 14. The selector 16 has an input connected to an output of the adder 13, an input connected to an output of the level selector 22, and an input connected to an output of the low-frequency pulse generator 7.

In the sweep unit 3 of FIG. 4, the low-frequency pulse generator 7 starts outputting low-frequency pulses upon receiving an out-of-sync alarm signal (ALM). The counter 21 counts the low-frequency pulses from the low-frequency pulse generator 7. The level selector 22 outputs a sweep signal to the selector 16 of the loop filter 2 based on the count of the pulses. The sweep signal in this embodiment may have a selected level which sequentially varies from one of a plurality of discrete values to another at given periods in a repeating manner as shown in FIG. 1. Alternatively, the sweep signal may have a selected level which discontinuously varies at random from one of a plurality of discrete values to another.

In the embodiment of FIG. 4, the gate circuit 23 is constituted by an AND gate. The count control unit 24 outputs an on-state signal (or "1") to the AND gate 23 upon receiving the out-of-sync alarm signal (ALM) so as to allow the AND gate 23 to output the pulse to the counter 21. However, the count control unit 24 inhibits the AND gate 23 from outputting the pulse to the counter 21 only when a first one of the pulses from the pulse generator 7 is output to the AND gate 23 in response to the out-of-sync alarm signal (ALM). At this time, the pulse generator 7 outputs the first pulse to the selector 16, and the selector 16 is controlled by a rising edge of the pulse from the pulse generator 7. The level selector 22 supplies the sweep signal through the selector 16 to the flip-flop 14 when the pulse from the pulse generator 7 is at the rising edge. The count of the pulses, retained in the counter 21 at this time, remains unchanged from a previous content of the counter 21 at the end of pulling into synchronism at a previous time. The level selector 22 outputs a sweep signal to the selector 16 of the loop filter 2 based on the previously retained count of the pulses at the start of pulling into synchronism at a next time. Therefore, the reference carrier generator device of the present embodiment is remarkably effective in quickly pulling a reference carrier into synchronism.

Figure 5A:
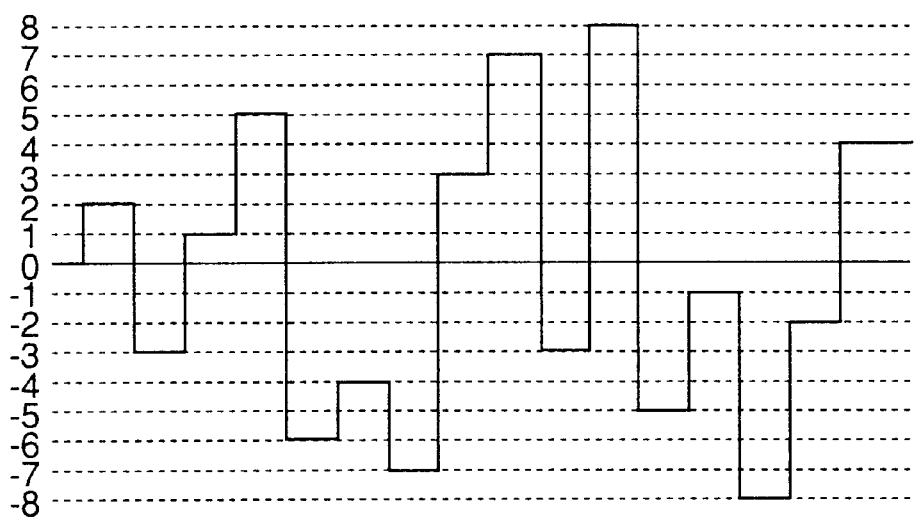
FIG. 5A and FIG. 5B are time charts for explaining a waveform of a sweep signal in one embodiment of the reference carrier generator device of the present invention.

Next, FIG. 5A shows a waveform of a sweep signal in one embodiment of the reference carrier generator device of the present invention.

In the embodiment of FIG. 1, the level selection unit 6 outputs a staircase sweep signal having a selected level which sequentially increases from one of the values zero, one and two to another at given periods in a repeating manner.

As shown in FIG. 5A, the sweep signal in the present embodiment has a selected level which discontinuously varies at random from one of a plurality of discrete values −8 through +8 to another. The sweep unit 3 of FIG. 4 may be configured to output the sweep signal shown in FIG. 5A. In such an embodiment, the counter 21 counts the low-frequency pulses from the low-frequency pulse generator 7, and the level selector 22 outputs a sweep signal based on the count of the pulses. The count of the pulses by the counter 21 increases linearly. By using a random number generator, one of the plurality of discrete values −8 through +8 is selected at random as the selected level of the sweep signal, and it is possible for the level selector 22 to output such a sweep signal based on the count of the pulses.

Figure 5B:
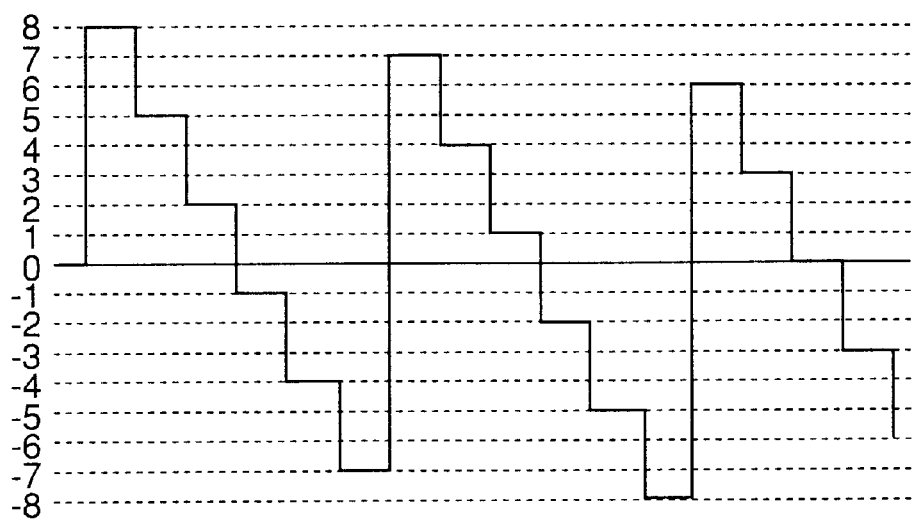
Figure 6:
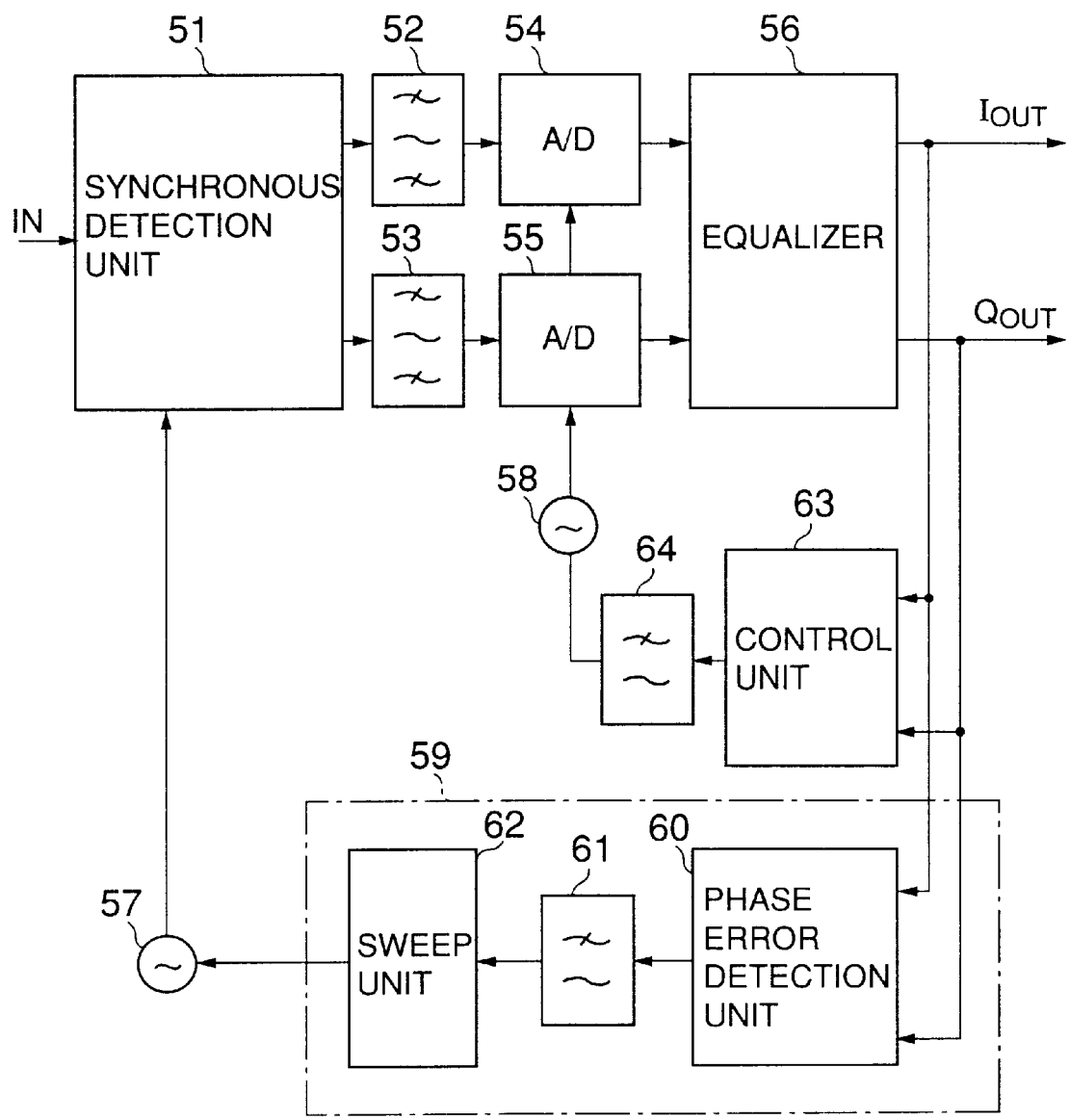
FIG. 6 is a diagram for explaining a conventional analog demodulator system.
Figure 7:
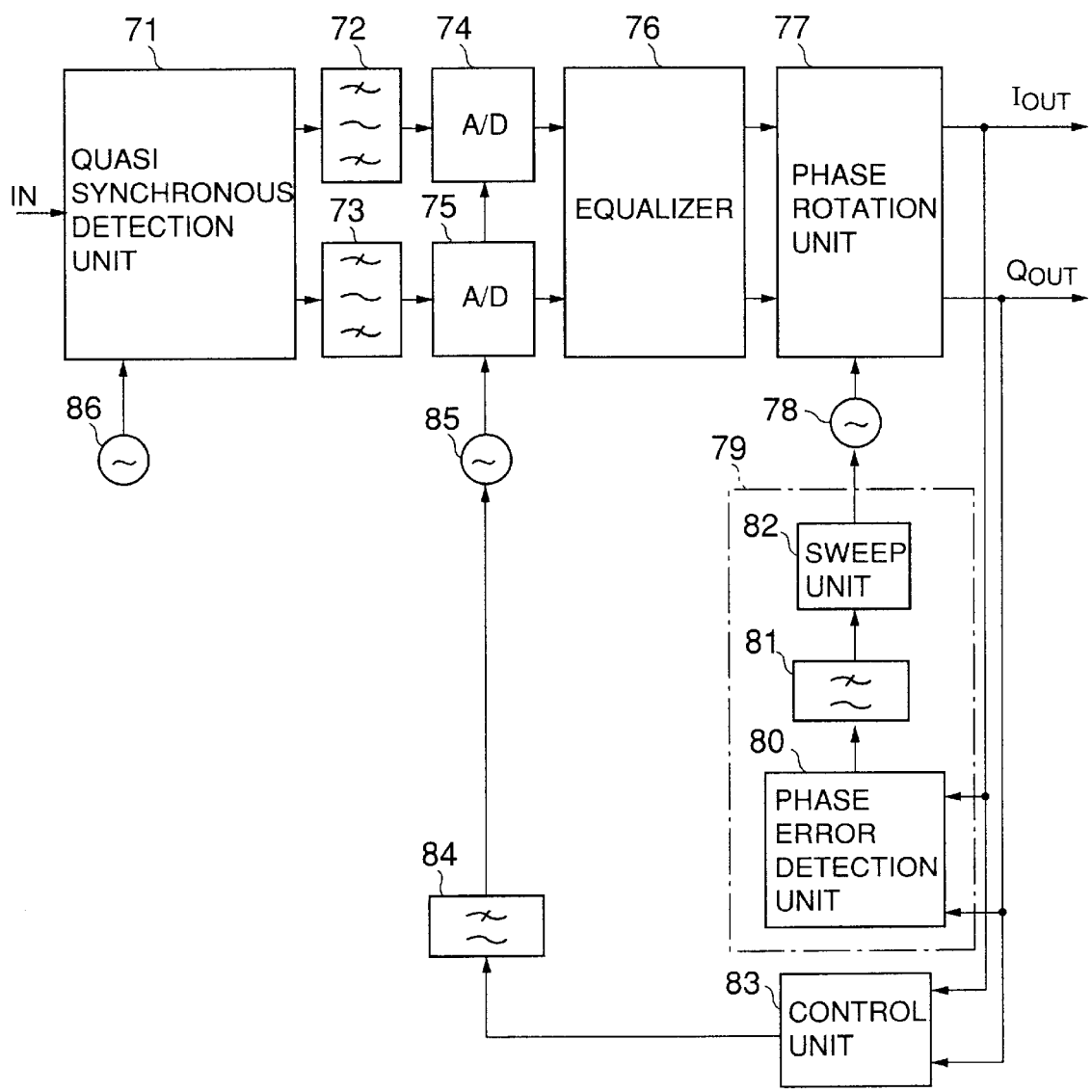
FIG. 7 is a diagram for explaining a conventional digital demodulator system.
Figure 8:
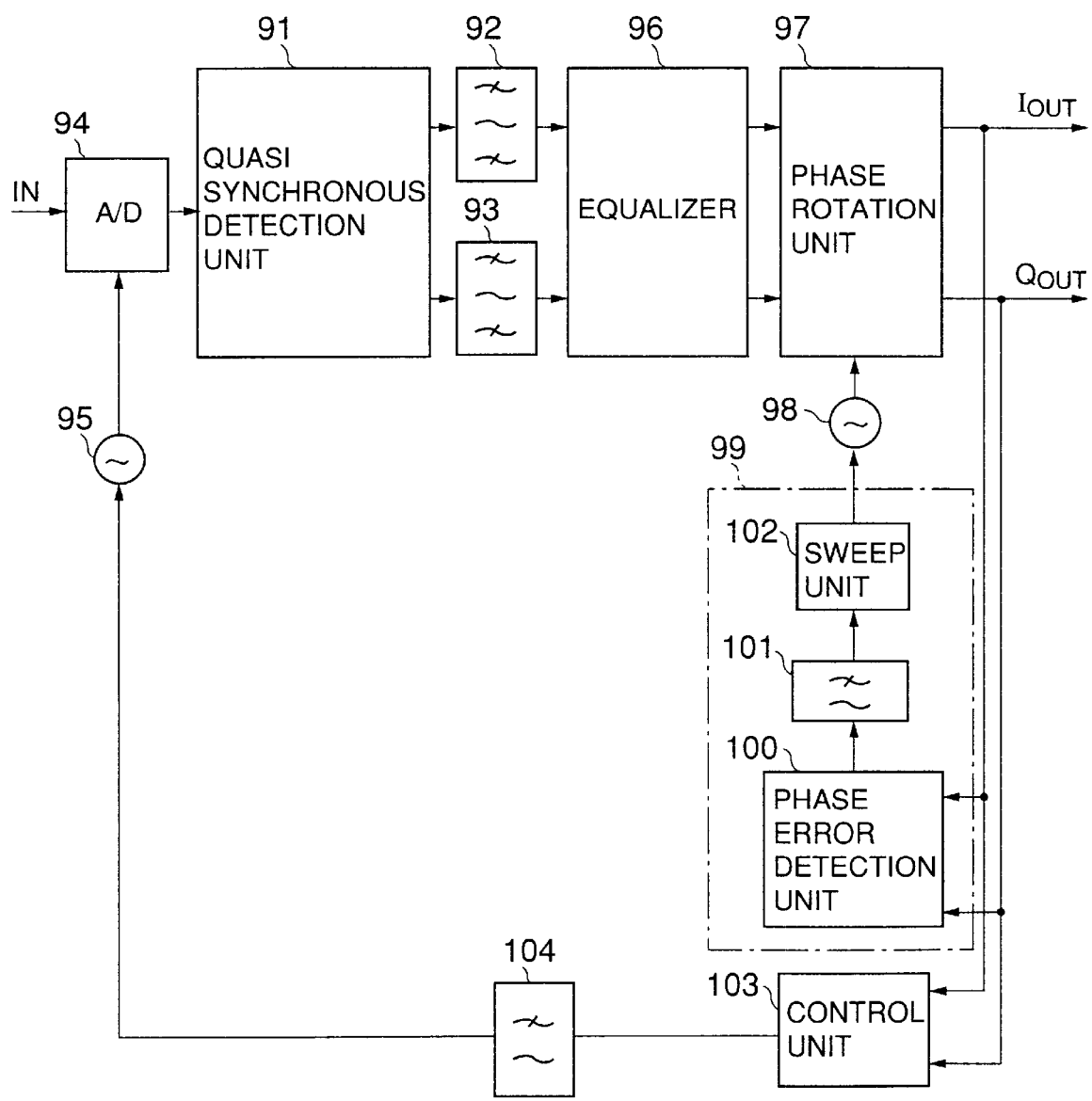
FIG. 8 is a diagram for explaining another conventional digital demodulator system.
Figure 9:
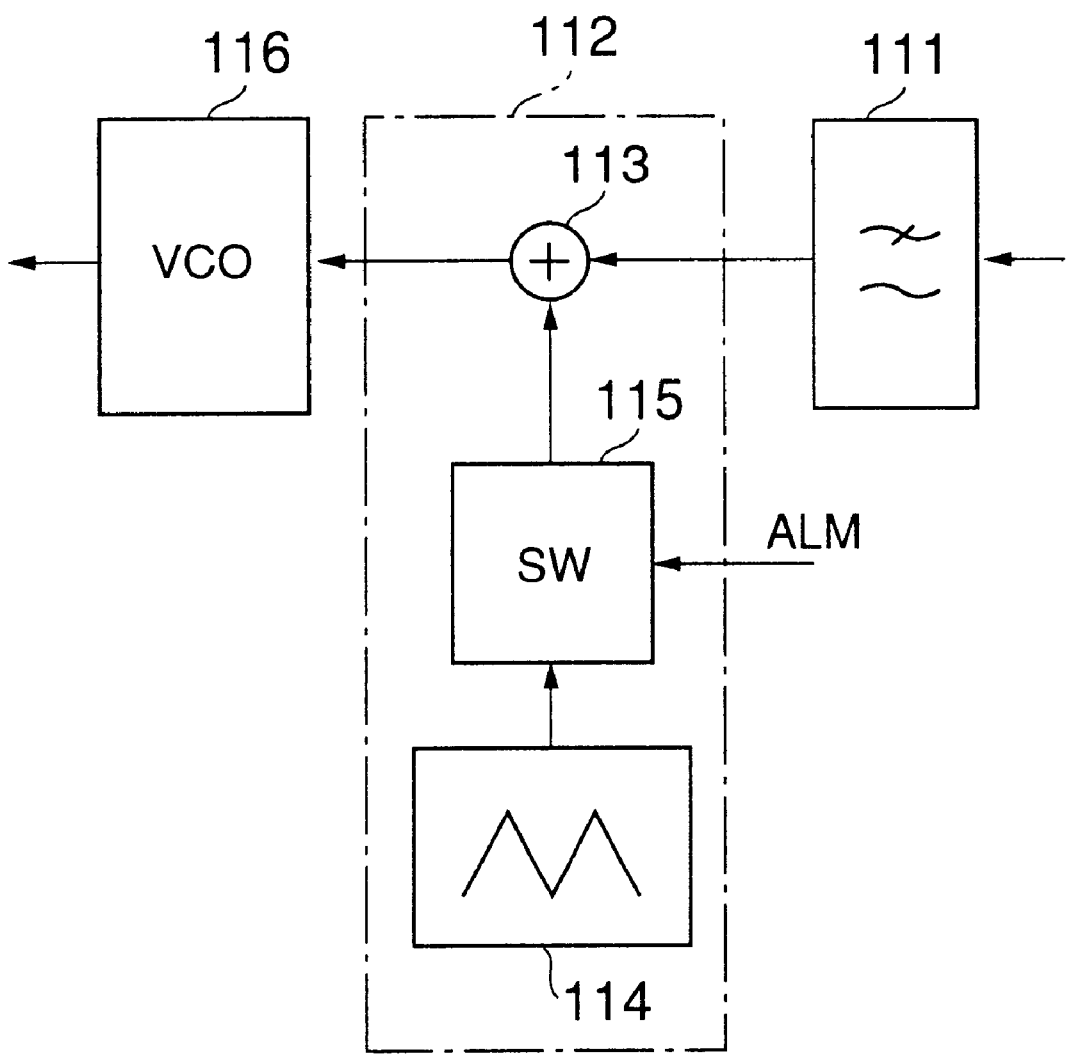
FIG. 9 is a diagram for explaining a sweep unit in the demodulator systems of FIG. 6 through FIG. 8.

FIG. 5B shows a waveform of a sweep signal in one embodiment of the reference carrier generator device of the present invention.

As shown in FIG. 5B, the sweep signal has a selected level which sequentially decreases by a predetermined step (which is equal to the value three in the example of FIG. 5B) from one of a plurality of discrete values −8 through +8 to another at given periods in a repeating manner. Further, the maximum value or the minimum value of the selected level of the sweep signal sequentially decreases in order to provide a large repeated period for the selected level of the sweep signal. The sweep unit in the reference carrier generator device of the present invention may be configured to output such a sweep signal. The reference carrier generator device of such an embodiment can easily and quickly pull a reference carrier out of a false stabilized point into a correct stabilized point of synchronism even after the reference carrier is set at the false stabilized point.

Further, the present invention is not limited to the above-described embodiments, and variations and modifications may be made without departing from the scope of the present invention.

For example, the sweep unit 3 of FIG. 4 may be configured to include a memory unit. In such a modification, a selected value of a sweep signal, previously output by the level selector 22 when pulling the reference carrier into synchronism in response to an out-of-sync alarm signal, is stored in the memory unit, and the level selector 22 subsequently outputs a selected value of a sweep signal based on the stored selected value of the memory unit when starting to pull the reference carrier into synchronism at a next time.

The sweep unit 3 in the reference carrier generator device of the present invention may be configured to include a random number generator. In such a modification, the sweep unit outputs a sweep signal having a selected level which varies at random based on a random number output by the random number generator.

Further, the loop filter 2 in the reference carrier generator device of the present invention may be configured by using another digital filter. The loop filter 2 and the level selection unit 6 in the reference carrier generator device of the present invention may be configured by using an arithmetic and logic operation of a microprocessor.

What is claimed is:

1. A reference carrier generator device comprising:
a phase error detection unit for detecting a phase error based on quadrature demodulated signals, and for outputting a phase error signal indicating the phase error;
a loop filter for passing the phase error signal from the phase error detection unit through the loop filter, and for converting the phase error signal into a control voltage;
a voltage-controlled oscillator for outputting a reference carrier synchronous with a quadrature modulated wave based on the control voltage; and
a sweep unit for changing the control voltage to the oscillator when pulling the reference carrier into synchronism in response to an incoming out-of-sync alarm signal, wherein the sweep unit outputs a staircase sweep signal having a rising edge with a selected level which discontinuously varies at random from one of a plurality of discrete values to another of said plurality of discrete values, the staircase sweep signal being added to the phase error signal such that the control voltage output to the oscillator is intermittently changed to another voltage and said another voltage is intermittently retained by the staircase sweep signal.

2. The reference carrier generator device according to claim 1, wherein the loop filter is constituted by a digital filter, and the sweep unit resets a frequency component of the phase error signal on a frequency-control signal line of the digital filter when the pulling of the reference carrier into synchronism is started in response to the out-of-sync alarm signal.

3. The reference carrier generator device according to claim 1, wherein the sweep unit outputs a staircase sweep signal having a selected level which sequentially increases from one of a plurality of discrete values to another at given periods in a repeating manner.

4. The reference carrier generator device according to claim 1, wherein the sweep unit outputs a staircase sweep signal having a selected level which sequentially decreases from one of a plurality of discrete values to another at given periods in a repeating manner.

5. The reference carrier generator device according to claim 1, wherein the sweep unit outputs a staircase sweep signal having a selected level which discontinuously varies at random from one of a plurality of discrete values to another.

6. The reference carrier generator device according to claim 1, wherein the loop filter and the sweep unit are configured to reset a frequency component of the phase error signal in the loop filter when the sweep unit outputs the staircase sweep signal.

7. The reference carrier generator device according to claim 1, wherein the sweep unit is configured to retain a count of pulses at an end of pulling into synchronism at a previous time and to output the staircase sweep signal based on the retained count of pulses at a start of pulling into synchronism at a next time.

8. A reference carrier generator device comprising:

a phase error detection unit for detecting a phase error based on quadrature demodulated signals, and for outputting a phase error signal indicating the phase error;

a loop filter for passing the phase error signal from the phase error detection unit through the loop filter, and for converting the phase error signal into a control voltage;

a voltage-controlled oscillator for outputting a reference carrier synchronous with a carrier of a quadrature modulated wave based on the control voltage; and a sweep unit for changing the control voltage to the oscillator when pulling the reference carrier into synchronism in response to an incoming out-of-sync alarm signal, wherein the sweep unit outputs a staircase sweep signal having a selected level, the staircase sweep signal being added to the phase error signal such that the control voltage output to the oscillator is intermittently changed to another voltage and said another voltage is intermittently retained by the staircase sweep signal;

wherein the loop filter includes:

a flip-flop for temporarily retaining a frequency component of the phase error signal from the phase error detection unit; and a selector responsive to a pulse from the sweep unit for selectively outputting one of the frequency component of the phase error signal and the staircase sweep signal from the sweep unit to the flip-flop.

9. A reference carrier generator device comprising:

a phase error detection unit for detecting a phase error based on quadrature demodulated signals, and for outputting a phase error signal indicating the phase error;

a loop filter for passing the phase error signal from the phase error detection unit through the loop filter, and for converting the phase error signal into a control voltage;

a voltage-controlled oscillator for outputting a reference carrier synchronous with a carrier of a quadrature modulated wave based on the control voltage; and a sweep unit for changing the control voltage to the oscillator when pulling the reference carrier into synchronism in response to an incoming out-of-sync alarm signal, wherein the sweep unit outputs a staircase sweep signal having a selected level the staircase sweep signal being added to the phase error signal such that the control voltage output to the oscillator is intermittently changed to another voltage and said another voltage is intermittently retained by the staircase sweep signal;

wherein the sweep unit includes:

a low-frequency pulse generator for starting outputting of low-frequency pulses upon receiving the out-of-sync alarm signal, and for stopping the outputting of the pulses when no out-of sync alarm signal is received;

a counter for counting the pulses from the low-frequency pulse generator;

a level selector for outputting the staircase sweep signal having the selected level based on the count of the pulses by the counter; and a count control unit for outputting an on-state signal upon receiving the out-of-sync alarm signal, and for inhibiting the outputting of the pulses from the pulse generator to the counter only when the pulse generator first outputs one of the pulses in response to the out-of-sync alarm signal.

* * * * *